(12) United States Patent
Tien et al.

(10) Patent No.: US 11,404,533 B2
(45) Date of Patent: Aug. 2, 2022

(54) CAPACITANCE STRUCTURE AND MANUFACTURING METHOD THEREOF

(71) Applicant: NANYA TECHNOLOGY CORPORATION, New Taipei (TW)

(72) Inventors: Lai-Cheng Tien, New Taipei (TW);
Wei-Chuan Fang, New Taipei (TW);
Yu-Ting Lin, New Taipei (TW);
Mao-Ying Wang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 52 days.

(21) Appl. No.: 16/995,843

(22) Filed: Aug. 18, 2020

(65) Prior Publication Data
US 2022/0059648 A1    Feb. 24, 2022

(51) Int. Cl.
*H01L 49/02* (2006.01)
*H01G 4/30* (2006.01)
*H01G 4/232* (2006.01)
*H01G 4/005* (2006.01)

(52) U.S. Cl.
CPC ............. *H01L 28/90* (2013.01); *H01G 4/005* (2013.01); *H01G 4/232* (2013.01); *H01G 4/30* (2013.01)

(58) Field of Classification Search
CPC ........ H01L 28/90; H01G 4/005; H01G 4/232; H01G 4/30
USPC ............... 361/301.4, 303, 312, 328; 257/532
See application file for complete search history.

(56) References Cited

U.S. PATENT DOCUMENTS 6,893,914 B2 * 5/2005 Kim .................. H01L 27/10894
438/254

FOREIGN PATENT DOCUMENTS

WO    WO-2018198330 A1 * 11/2018 ........... H01L 21/283

* cited by examiner

*Primary Examiner* — Arun Ramaswamy
(74) *Attorney, Agent, or Firm* — CKC & Partners Co., LLC

(57) ABSTRACT

A capacitance structure includes a substrate, a plurality of rod capacitors and an oxide layer. The rod capacitors are located on a top surface of the substrate and form a capacitor array. The oxide layer covers a top and a side of the capacitor array and a portion of the substrate. The rod capacitors extend along a first direction perpendicular to a second direction in which the top surface of the substrate extends. The oxide layer extends from the top of the capacitor array to the substrate along a third direction, and an angle is formed between the first and third directions.

9 Claims, 12 Drawing Sheets

CAPACITANCE STRUCTURE AND MANUFACTURING METHOD THEREOF

BACKGROUND

Technical Field

The present disclosure relates to a capacitance structure and a manufacturing method of the capacitance structure.

Description of Related Art

For a capacitor array, a contact short is easily found due to a localized stress, which is caused by asymmetry container profile. The localized stress damages a semiconductor structure where the capacitor array is formed within.

Therefore, a low stress capacitance structure including capacitor array is needed to improve such phenomenon.

SUMMARY

One aspect of the present disclosure is related to a capacitance structure. A capacitance structure includes a substrate, a plurality of rod capacitors and an oxide layer. The rod capacitors are located on a top surface of the substrate and form a capacitor array. The oxide layer covers a top and a side of the capacitor array and a portion of the substrate. The rod capacitors extend along a first direction perpendicular to a second direction where the top surface of the substrate extends and form a capacitor array. The oxide layer extends from the top of the capacitor array to the substrate along a third direction, and an angle is formed between the first and third directions.

In one or more embodiments, the capacitance structure further includes a first supporting layer and a second supporting layer. The first and second supporting layers connect sides of the rod capacitors and are covered by the oxide layer. Each of the first and second supporting layers protrudes from the side of the capacitor array in the second direction. The first supporting layer is located between the second supporting layer and the top surface of the substrate. The first supporting layer has an extra length with respect to the second supporting layer in the second direction such that a length of the first support layer is greater than a length of the second supporting layer and the oxide layer extends along the third direction.

In some embodiments, the second supporting layer is located at the top of the capacitor array.

In one or more embodiments, each rod capacitor includes an insulating tube filled with conductive material.

In some embodiments, the conductive material of the rod capacitors is a film covering and contacting the insulating tubes.

In some embodiments, the capacitance structure further includes a plurality of third supporting layers connecting sides of the insulating tubes. The film further covers the third supporting layers.

In one or more embodiments, a plurality of transistors is formed within the substrate. Each transistor has a contact exposed to the top surface of the substrate. Each rod capacitor is connected to the contact of a corresponding one of the transistors.

In one or more embodiments, the capacitance structure further includes a conductive layer located between the capacitor array and the oxide layer and electrically connected to the rod capacitors.

In some embodiment, the capacitance structure further includes an insulating material and a conductive line. The insulating material covers the oxide layer and the capacitor array. The conductive line extends to the conductive layer through the insulating material along the first direction.

One aspect of the present disclosure is related to a method of capacitance structure manufacturing. The method includes following operations. Etch the second supporting material to form a second supporting layer connecting the insulating tubes. Anisotropically etch second insulating material to form a second insulating layer protruding from the second supporting layer in the second direction. Etch the first supporting material along the second insulating layer to form a first supporting layer protruding from the second supporting layer in second direction and connects the insulating tubes. Remove the second insulating layer and the first insulating material to expose the substrate. Fill up conductive material in the insulating tubes to form rod capacitors forming a capacitor array and covering an oxide layer from a top of the capacitor array to the substrate. The oxide layer is formed along the first and second supporting layer such that the oxide layer extends along a third direction having an angle with respect to the first direction.

In one or more embodiments, a plurality of transistors is formed within the substrate and has a plurality of exposed contacts on a top surface of the substrate, and each exposed contact is connected to a corresponding one of the rod capacitors.

In one or more embodiments, the method further includes following operations. Form a conducting layer electrical connected to the capacitor array before the oxide layer is formed, and the oxide layer further covers the conducting layer.

In some embodiments, the method further includes following operations. Form insulating material covering the oxide layer.

In some embodiments, the method further includes following operations. Flatten a top side of the insulating material by a chemical mechanical planarization process.

In some embodiments, the method further includes following operations. Form a conductive line extending from a top side of the insulating material to the conductive layer through the oxide layer.

In summary, the capacitance structure of the present disclosure has a slope oxide layer covering the capacitor array, and it avoids undesired damages by reducing localized stress.

The above description is only used to explain the problems to be solved by the present disclosure, the technical means for solving the problems and the produced effects. The specific details of the present disclosure are described in detail in the following embodiments and related drawings.

BRIEF DESCRIPTION OF THE DRAWINGS

The drawings disclose one or more embodiments of the present disclosure and, together with the explanation in the description, serve to explain the principles of the present disclosure. Wherever possible, the same reference numbers will be used throughout the drawings to refer to the same or like elements in the embodiments. These drawings include.

DETAILED DESCRIPTION

The following embodiments are disclosed with accompanying diagrams for a detailed description. For illustration clarity, many details are explained in the following description. However, it should be understood that these details do not limit the present disclosure. That is, these details are not necessary in parts of embodiments of the present disclosure. Furthermore, for simplifying the drawings, some of the conventional structures and elements are shown with schematic illustrations. Also, the same labels may be regarded as the corresponding components in the different drawings unless otherwise indicated. The drawings are drawn to clearly illustrate the connection between the various components in the embodiments, and are not intended to depict the actual sizes of the components.

In addition, terms used in the specification and the claims generally have their usual meaning as used in the field, in the context of the disclosure and in the context of the particular content unless particularly specified otherwise. Some terms used to describe the disclosure are discussed below or elsewhere in the specification to provide additional guidance related to the description of the disclosure to those in the art.

The phrases "first," "second," etc., are solely used to separate the descriptions of elements or operations with the same technical terms, and are not intended to convey a meaning of order or to limit the disclosure.

Additionally, the phrases "comprising," "includes," "provided," and the like, are all open-ended terms, i.e., meaning including but not limited to.

Further, as used herein, "a" and "the" can generally refer to one or more unless the context particularly specifies otherwise. It will be further understood that the phrases "comprising," "includes," "provided," and the like used herein indicate the stated characterization, region, integer, step, operation, element and/or component, and does not exclude additional one or more other characterizations, regions, integers, steps, operations, elements, components and/or groups thereof.

Figure 1:
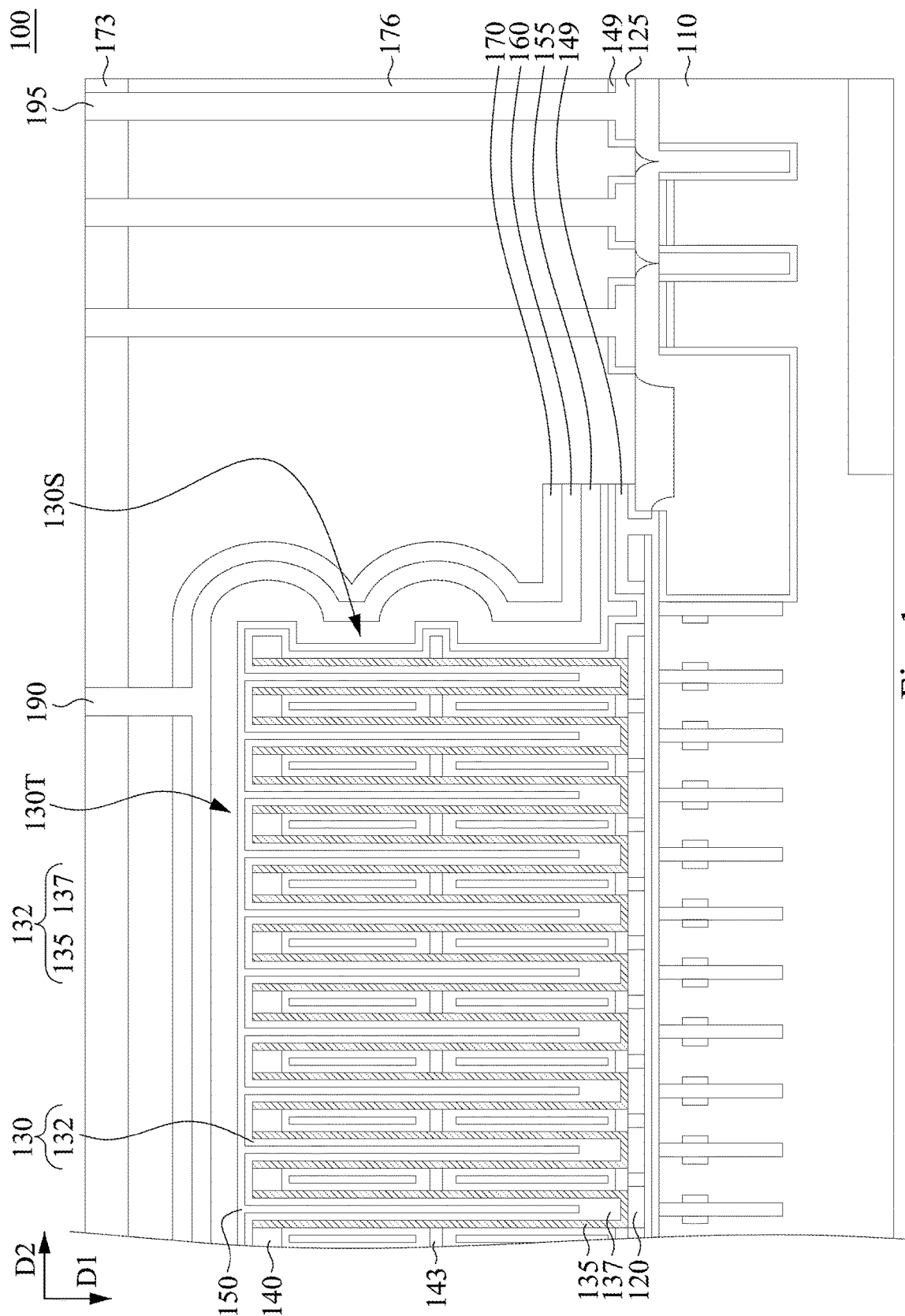
FIG. 1 is a local cross-section view of a capacitance structure according to one embodiment of the present disclosure.

Reference is made to FIG. 1. FIG. 1 is a local cross-section view of a capacitance structure 100 according to one embodiment of the present disclosure. In this embodiment, the local cross-section view illustrates a portion of a right half of the capacitance structure 100, and the capacitance structure 100 can be a symmetry rectangle.

The capacitance structure 100 includes a substrate 110, a capacitor array 130 formed by rod capacitors 132 arranged in parallel, supporting layers 140 and 143 connecting the rod capacitors 132 and an oxide layer 170 covering the capacitance array 130.

As shown in FIG. 1, the substrate 100 includes exposed contacts 120 and 125. The contacts 120 and 125 are exposed to a top surface of the substrate 110. In this embodiment, the exposed contacts 120 are respectively connected to transistors formed within the substrate 110, the exposed contacts 125 are connected to other circuit formed within the substrate 110, and unconductive nitride film 149 covers the exposed contacts 120 and 125.

The rod capacitors 132 are formed on the substrate 110 and respectively connected to the exposed contacts 120, which are respectively connected to transistors formed within the substrate 110. In this embodiment, each rod capacitor 132 is formed by an insulating tube 135 filled with conductive material 137.

The rod capacitors 132 are covered by a ti-nitride (Titanium nitride) layer 150 to enhance structural strength and a poly-silicon layer 155 and a tungsten layer 160 further cover the ti-nitride layer 150. The ti-nitride layer 150, the poly-silicon layer 155 and the tungsten layer 160 are located between the capacitor array 130 formed by the rod capacitors 132 and the oxide layer 170. Insulating oxide material 173 and 176 further cover the oxide layer 170 and the conductive lines 190 and 195 are respectively connected to the capacitor array 130 formed by rod capacitors 132 and the exposed contacts 195 through the oxide material 173 and 176.

As illustrated by FIG. 1, in this embodiment, a first direction D1 is a direction where the rod capacitors 132 extend from the substrate 110, and a second direction D2 is a direction in which the top surface of the substrate 110 extends and perpendicular to the first direction D1. In this embodiment, the oxide layer 170 covering a top 130T and a side 130S of the capacitor array 130 extends along the first direction D1, such the symmetry capacitance structure 100 can be a rectangle.

However, each the supporting layers 140 and 143 connecting the rod capacitors 132 makes the oxide layer 170 have a protruding part along the second direction D2. The protruding parts of the oxide layer 170 cause asymmetry profile, which induce localized stress within the oxide material 173 and 176, the induced localized stress cause unexpected damage in the oxide material 173 and 176, and the unexpected damage cause that the conductive lines 195 can electrically connect to each other. The electrical connecting of the conductive lines 195 can be regarded as an unexpected short for the capacitance structure 100.

Figure 2:
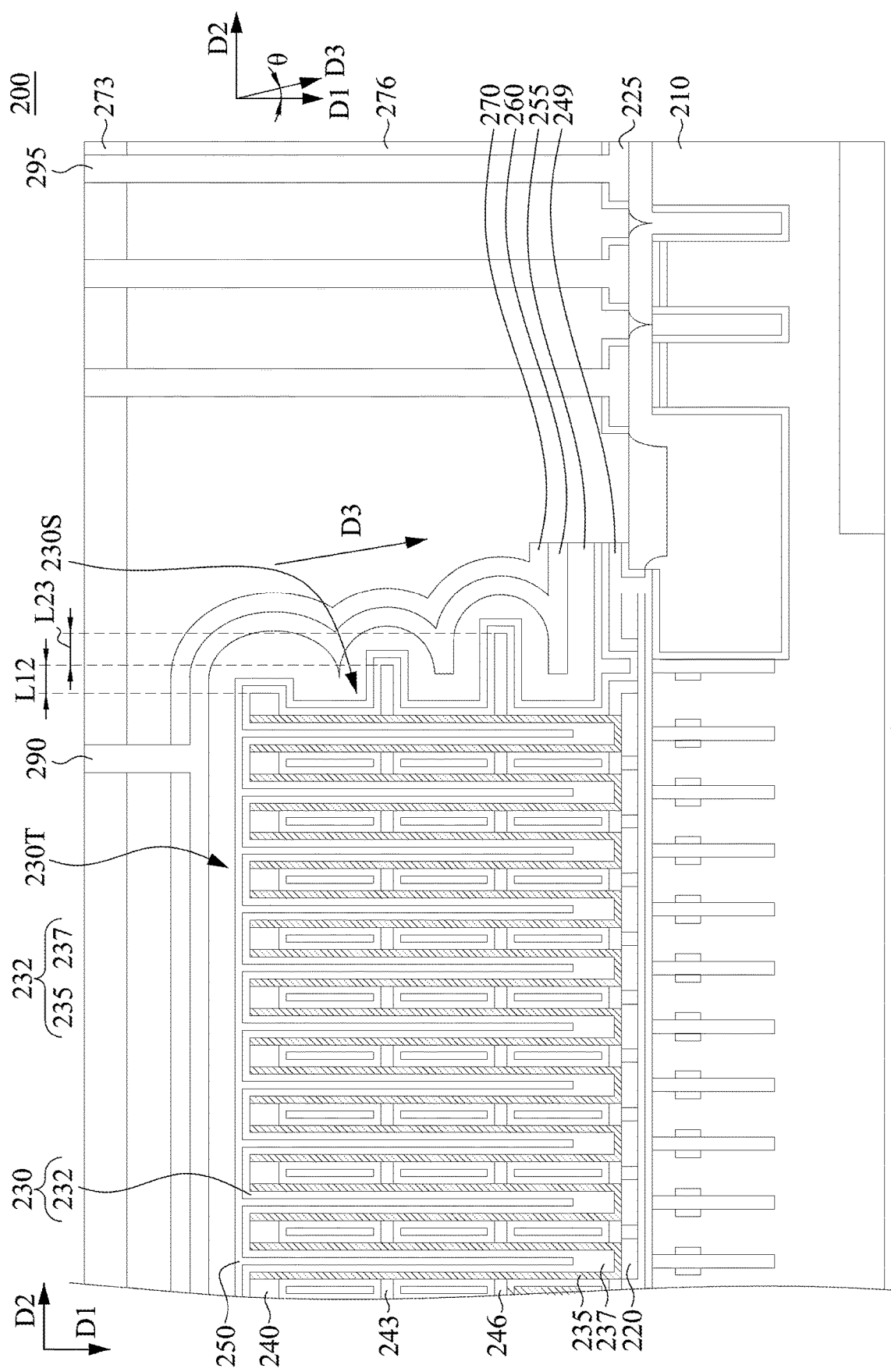
FIG. 2 is a local cross-section view of a capacitance structure according to another embodiment of the present disclosure.

Reference is made by FIG. 2. FIG. 2 is a local cross-section view of a capacitance structure 200 according to another embodiment of the present disclosure. In this embodiment, the local cross-section view of FIG. 2 illustrates a portion of a right half of the capacitance structure 200, and the capacitance structure 100 can be a symmetry trapezoid.

Similarly, the improved capacitance 200 includes a substrate 210, rod capacitors 232 arranged in parallel and an oxide layer 270. The rod capacitors 232 are located on a top surface of the substrate 210 and form a capacitor array 230. The supporting layers 240, 243 and 246 connect the rod capacitors 232 to form a capacitor array 230. The oxide layer 270 covers a top 230T and a side 230S of the capacitor array 230 and a portion of the substrate 210. The rod capacitors 232 extend along the first direction D1 perpendicular to the second direction D2 where the top surface of the substrate 210 extends. The oxide layer 270 covers the capacitor array 230 formed by the rod capacitors 232 and a portion of the top surface of the substrate 210.

As shown in FIG. 2, a plurality of transistors is formed within the substrate 210. Each transistor has a contact 220 exposed to the top surface of the substrate 210. Each rod capacitor 232 is connected to the contact 220 of a corresponding one of the transistors. Other exposed contacts 225 are connected to other circuits within the substrate 210. The exposed contacts 220 and 225 are covered by the unconductive nitride film 249.

In capacitance structure 200, each rod capacitors 232 is also formed by an insulating tube 235 filled with conductive material 237. A ti-nitride layer 250, a poly-silicon layer 255, a tungsten layer 260 are conductive layers and cover the capacitor array 230 formed by the rod capacitors 232 sequentially. The oxide layer 270 further covers the ti-nitride layer 250, the poly-silicon layer 255 and the tungsten layer 260. The oxide material 273 and 276 cover the oxide layer 270 and the contacts 225, and the conductive lines 290 and 295 respectively connected to the capacitor array 230 and the contacts 225. As shown in FIG. 2, the conductive lines 295 respectively extends to contacts 225 through the insulating oxide material 173, 176 and the nitride film 249. The conductive line 290 connected to the tungsten layer 260 through the oxide material 273, 276 and the oxide layer 270. The tungsten layer 260 is a conductive layer electrically connected the capacitor array 230 through the ploy-silicon layer 255 and the ti-nitride layer 250.

The difference between the capacitance structure 100 of FIG. 1 and the capacitance 200 of FIG. 2 is that the oxide layer 270 extends from the top of the capacitor array 230 to the substrate along a third direction D3 but not the first direction D1. As shown in FIG. 2, an angle θ greater than zero is formed between the first direction D1 and the third direction D3.

The support layers 240, 243 and 246 connect sides of the rod capacitors 232, and the support layers 240, 243 and 246 protrude from the side 230S of the capacitor array 230. In other words, each of the support layers 240, 243 and 246 has an edge protruding from the side 230S of the capacitor array 230. In this embodiment, the support layers 240, 243 and 246 connecting the rod capacitors 232 to form the capacitor array 232 have different lengths along the second direction D2. Both supporting layers 243 and 246 are located between the supporting layer 240 and the top surface of the substrate 210. As shown in FIG. 2, the supporting layers 240 is located at the top 230T of the capacitor array 230, the supporting layers 243 is located under the supporting layers 240 and has an extra length L12 with respect to the supporting layer 240 along the second direction D2, and the supporting layers 246 is located under the supporting layers 243 and has an extra length L23 with respect to the supporting layer 243 along the second direction D2. In other words, since the capacitance structure 200 is a symmetry trapezoid as mentioned above, a length of the supporting layer 243 is greater than a length of the supporting layer 240, and a length of the supporting layer 246 is greater than a length of the supporting layer 243.

Since the oxide layer 270 is formed along the support layers 240, 243 and 246, the oxide layer 270 can extend along the third direction D3. The angle θ greater than zero, the angle θ is formed between the first direction D1 and the third direction D3, and the oxide layer 270 can have a smooth extension since the protruding portions caused by supporting layers 240, 243 and 246 can be connected to each other to form a smooth slope for the oxide layer 270 covering the side 230S of the capacitor array 230. The smooth extension for the oxide layer 270 reduces the induced localized stress such that the unexpected short caused by the localized stress can be avoided.

Figure 3:
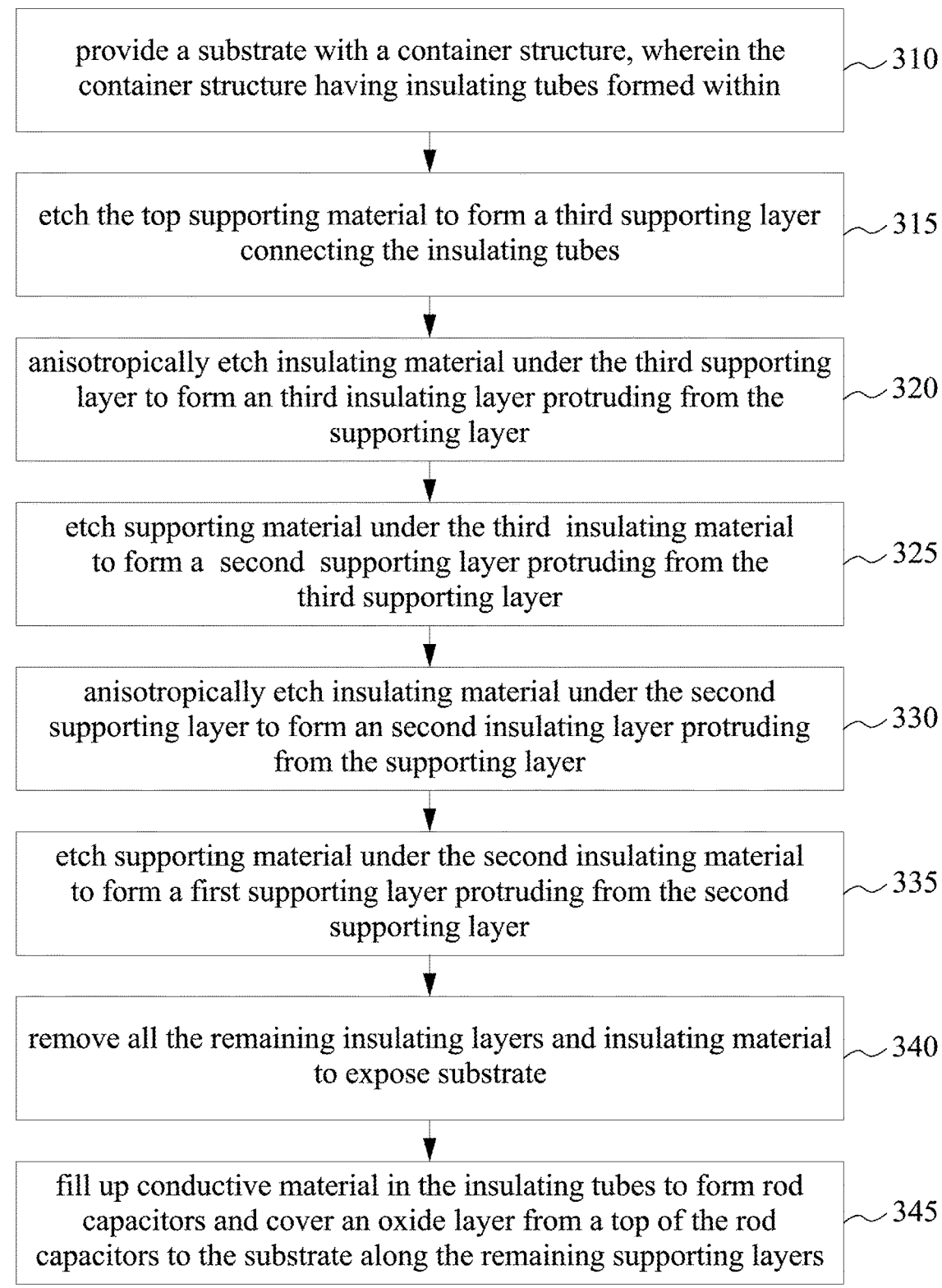
FIG. 3 is a flow chart of a method of capacitance structure manufacturing according to one embodiment of the present disclosure.

FIG. 3 is a flow chart of a method 300 of capacitance structure manufacturing according to one embodiment of the present disclosure. The method 300 includes operations 310-345. FIGS. 4A-4H respectively illustrate cross-section views in different operations of the method of FIG. 3.

It should be understood that the FIGS. 4A-4H are a cross-section view. In this embodiment, the insulating tubes 235 are arrange in a 2D array having rows and columns from a top view. The cross-section views shown in FIGS. 4A-4H is just a local cross-section of one row of the 2D array. In other words, intervals are between the insulating tubes 235.

Figure 4A:
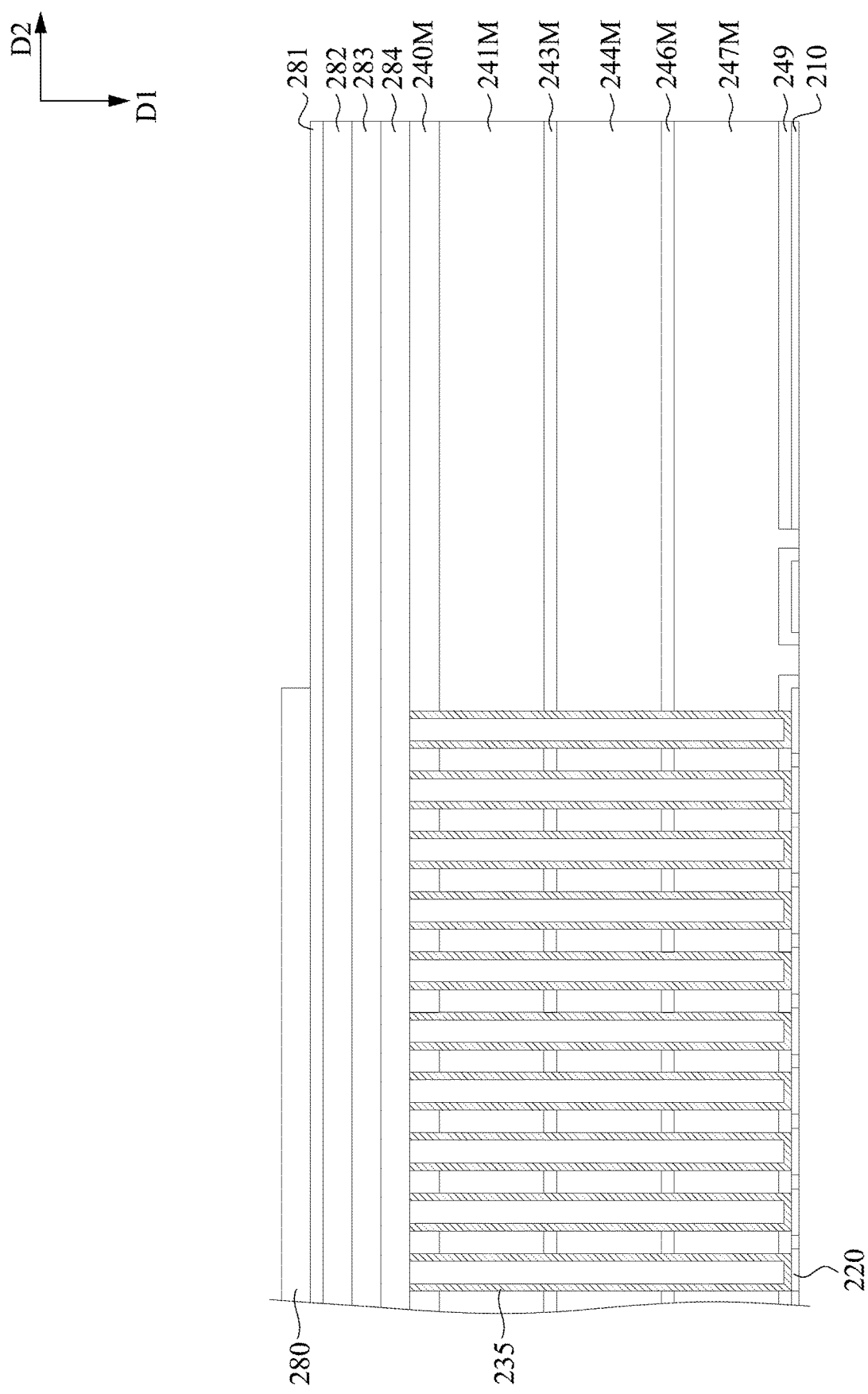
FIGS. 4A-4H respectively illustrate cross-section views in different operations of the method of FIG. 3.

Reference is made in FIGS. 3 and 4A. In operation 310, provide a substrate 210 with a container structure. The container structure is located on the substrate 210 and having formed insulating tubes 235 formed within, and the insulating tubes 235 are used for rod capacitors 232. As shown in FIG. 4A, the container structure on the substrate 210 includes an insulating material 247M, supporting material 246M, an insulating material 244M, a supporting material 243M, an insulating material 241M and a supporting material 240 stacked in order from bottom to top. The substrate 210 includes the nitride film 249 used to insulating the exposed contacts 220. A plurality of insulating tubes 235 is formed within the container structure and extended along a first direction D1 perpendicular to the second direction D2 where a top surface of the substrate 210 extends.

In this embodiment, the supporting material 240M, 243M and 246M are nitride, and the insulating material 241M, 244M and 247M are oxide. As shown in FIG. 4A, a nitride layer 284, two oxide layers 282 and 283 are further formed on the container structure. A hard mask 280 and an underlayer 281 below are formed on the oxide layer 282 for etching.

Figure 4B:
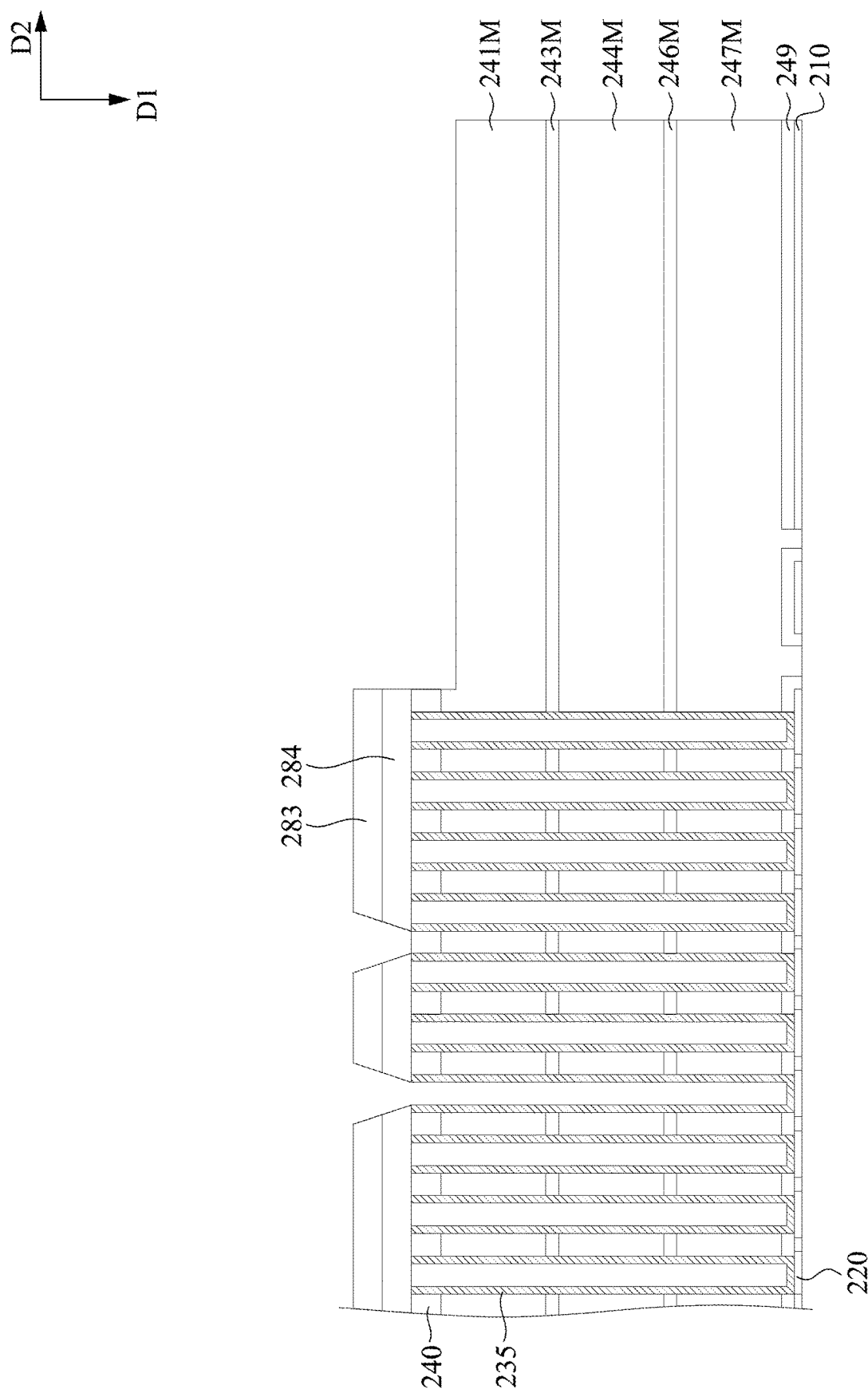

Reference is made in FIGS. 3 and 4B. In operation 315, etch the supporting material 241M to form a supporting layer 240 connecting the insulating tubes 235. The supporting layer 240 is at tops of the insulating tubes 235 and protrudes form sides of edge insulating tube 235.

The hard mask 280 and the underlayer 281 are removed through the etching process in operation 315. The hard mask 280 partially protects the oxide layer 283 and the nitride layer 284. The container structure under the hard mask 281 is reserved roughly. However, as shown in FIG. 4B, some of the oxide layer 283 and the nitride layer 284 under the hard mask 280 can still be removed in some embodiments.

Figure 4C:
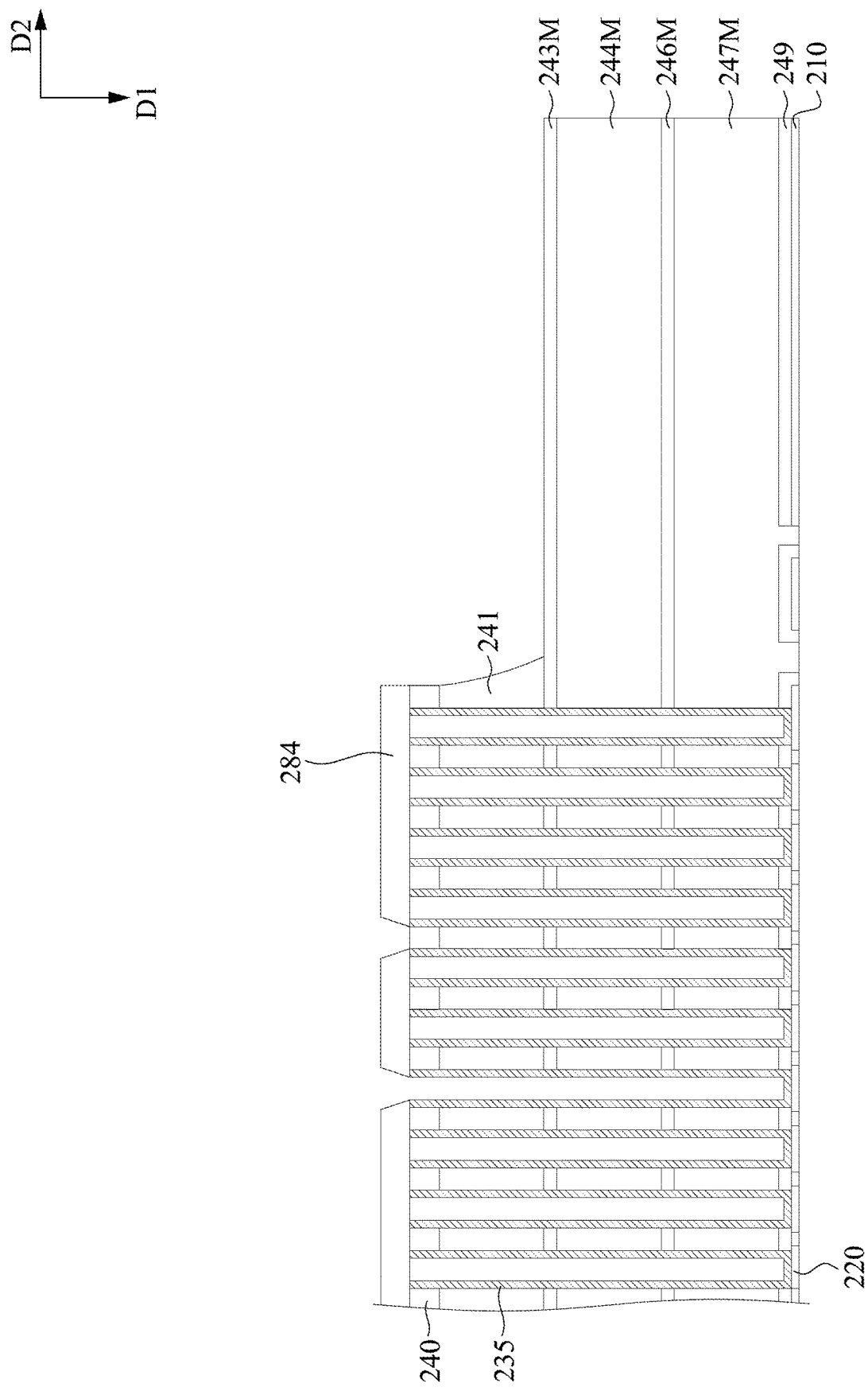

Reference is made in FIGS. 3 and 4C. In operation 320, anisotropically etch the insulating material 241M to form an insulating layer 241 protruding from the supporting layer 240. The oxide layer 283 and lots of insulating material 241m are removed. By anisotropic etching process, the insulating layer 241 formed by insulating material 241M can have a slope from edge of the supporting layer 240 to a top of the supporting material 243M.

Figure 4D:
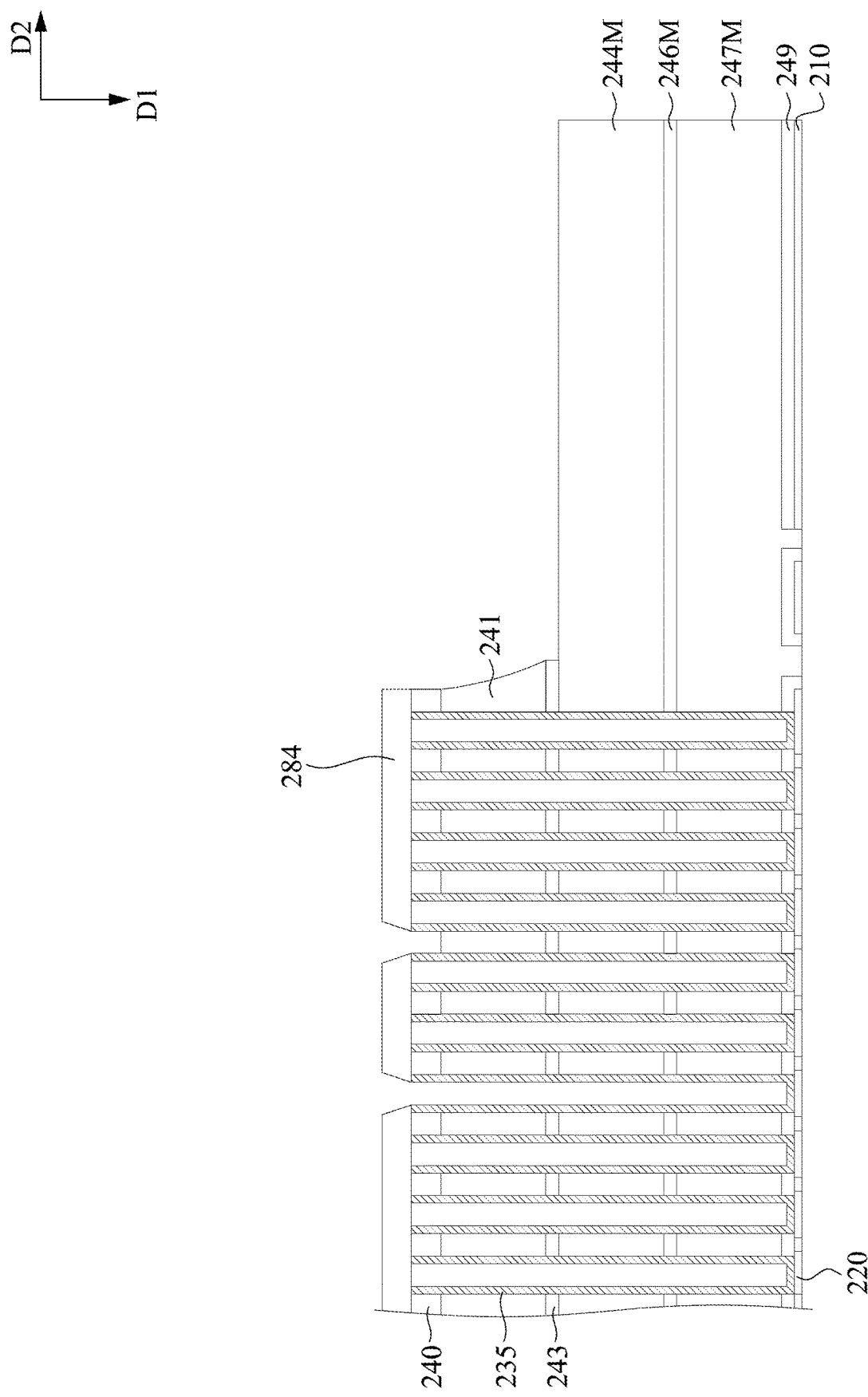

Reference is made in FIGS. 3 and 4D. In operation 325, etch the supporting material 243M along the protruding insulating layer 241 to form a supporting layer 243 protruding from the supporting layer 240 in second direction D2. The supporting layer 243 connects the insulating tubes 235. The slope of the insulating material 241 protects the reserved supporting layer 243. As shown in FIG. 4D, in some embodiment, some of the first supporting layer 240 is removed. However, the first supporting layer 240 still has a portion protruding from the side of edge insulating tubes 235.

Figure 4E:
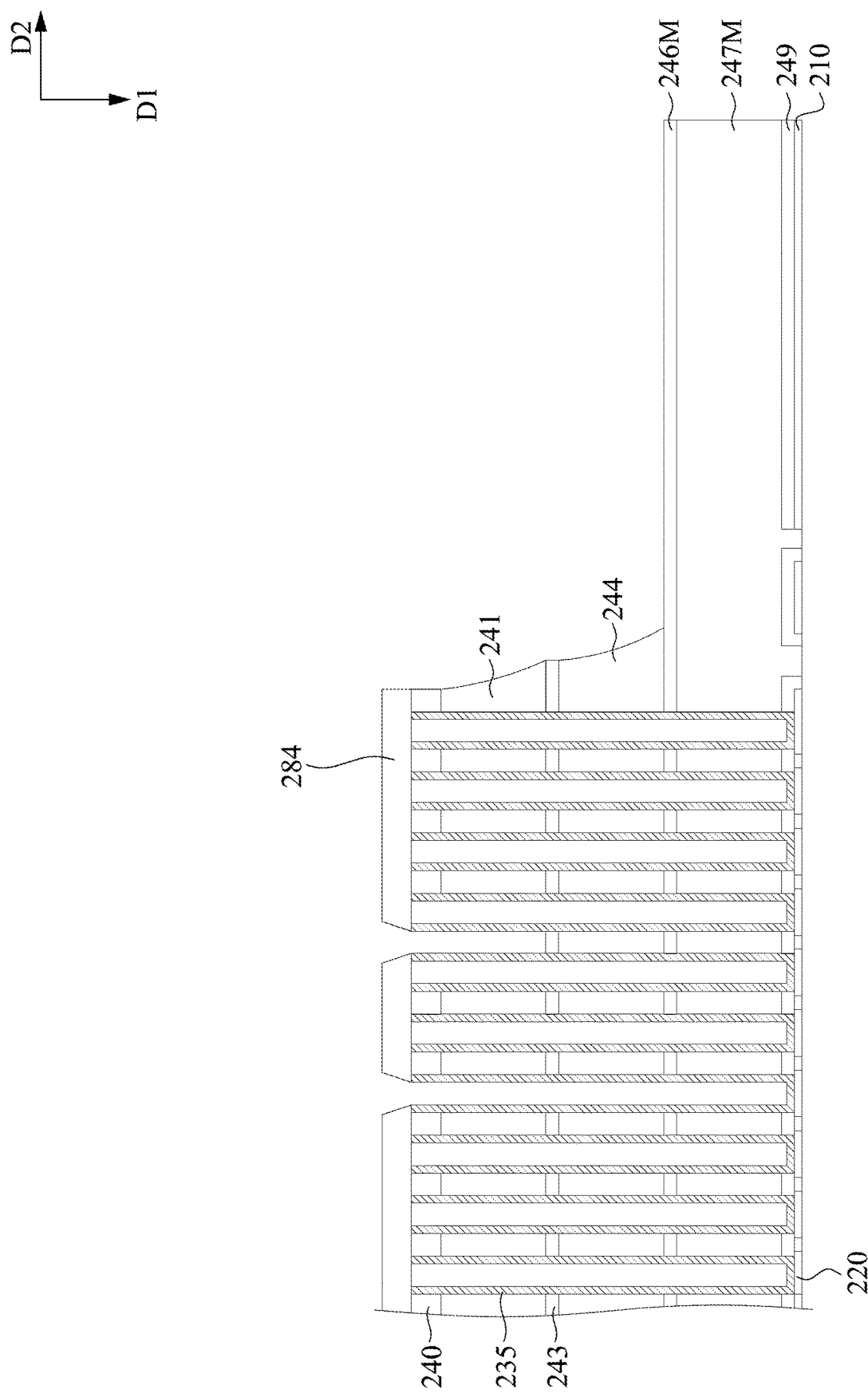

Reference is made in FIGS. 3 and 4E. Similarly to operation 320, in operation 330, anisotropically etch the insulating material 244M to form an insulating layer 244 protruding from the supporting layer 243. Some of the insulating layer 241 can be further removed. The formed insulating layer 244 has a slope from edge of the supporting layer 243 to a top of the supporting material 244M.

Figure 4F:
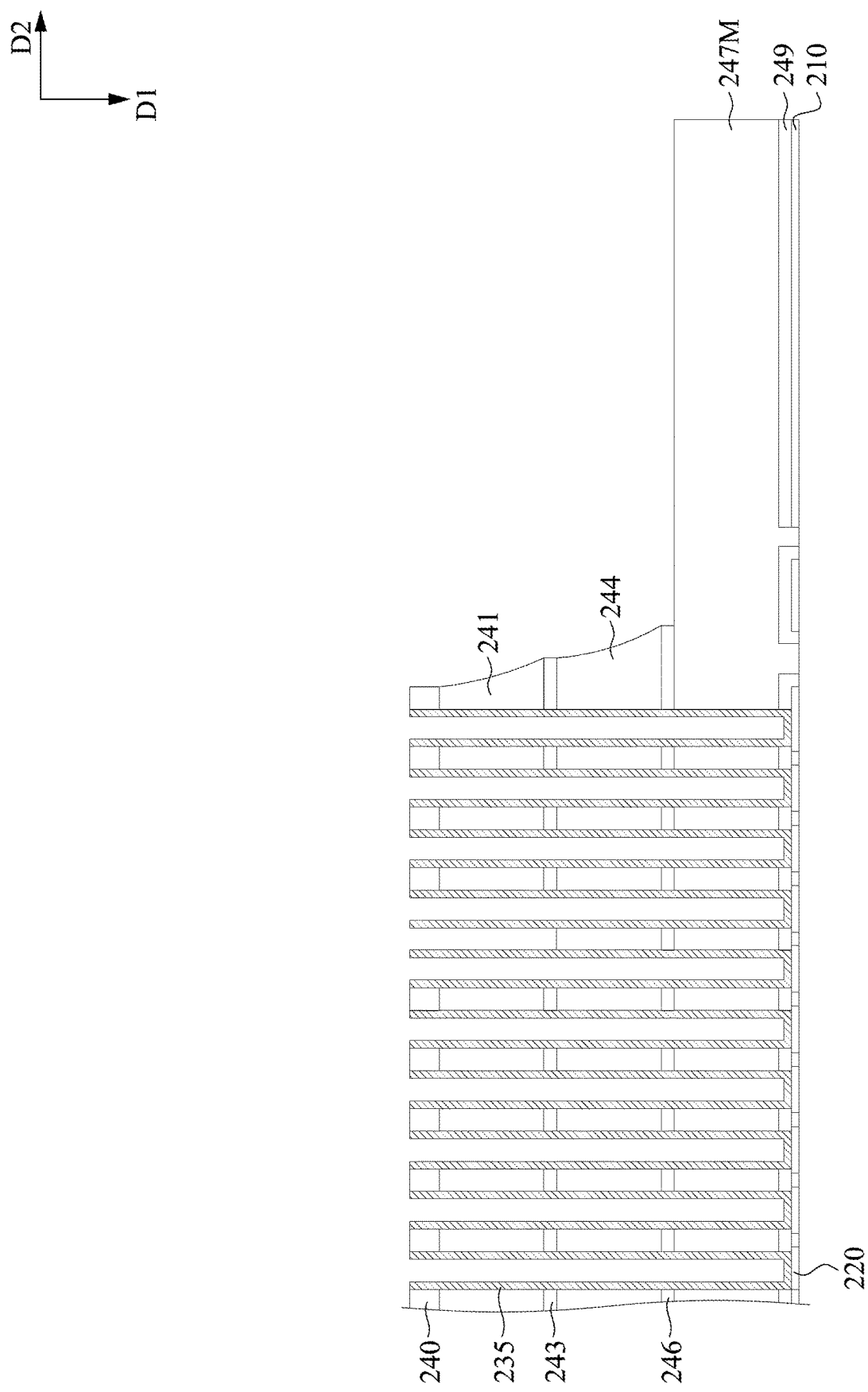

Reference is made in FIGS. 3 and 4F. Similarly to operation 325, In operation 335, etch the supporting material 246M along the protruding insulating layer 244 to form a supporting layer 246 further protruding from the supporting layer 246 in second direction D2. The nitride layer 284 is removed, and some of the supporting layer 244 can be also removed.

Figure 4G:
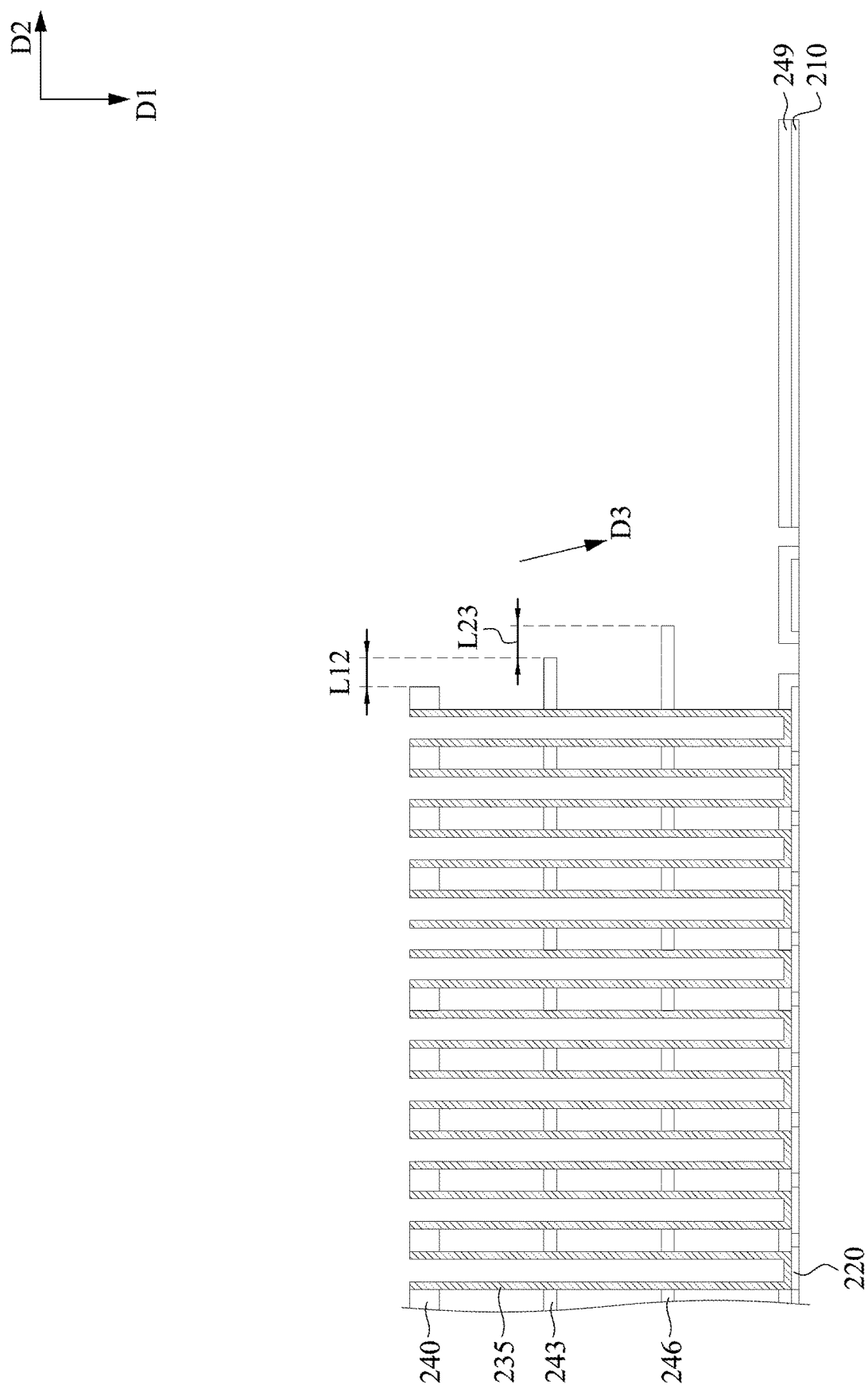

Reference is made in FIG. 3 and FIG. 4G. In operation 340, remove all the remaining insulating layers 241, 244 and insulating material 247M to exposed substrate 210. As shown in FIG. 4G, the length difference between the supporting layer 240 and 243 is the extra length L12, and the length difference between the supporting layer 243 and 246 is the extra length L23. In other words, the supporting layer 243 protrudes from the supporting layer 240, and the supporting layer 246 further protrudes from the supporting layer 243. The supporting layers 240, 243 and 246 have a trapezoid-like arrangement, and the edge of the supporting layers 240, 243 and 246 are arranged along the third direction D3. An angle θ is formed between the first direction D1 and the third direction D3.

Figure 4H:
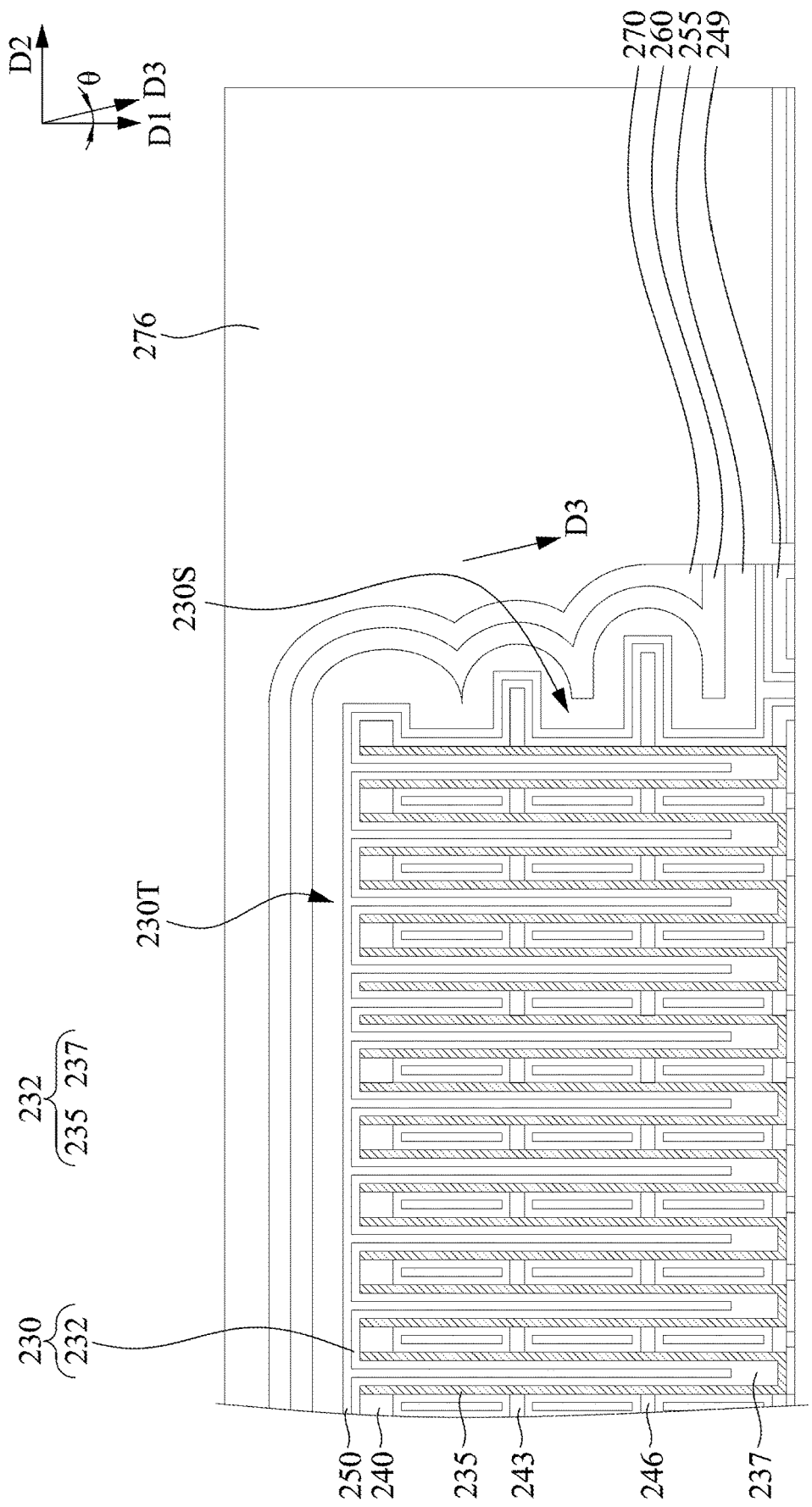

Reference is made in FIG. 3 and FIG. 4H. In operation 345, fill up conductive material 237 in the insulating tubes 235 to form rod capacitors 232 and cover an oxide layer 270 from a top of the rod capacitors 232 to the substrate 210 along the remaining supporting layers 240, 243 and 246. In other words, the rod capacitors 232 forms a capacitor array 230, and the oxide layer 270 covers a top 230T and a side 230S of the capacitor array 230.

In this embodiment, after filling up conductive material 237 to form the rod capacitors 232, the rod capacitors 232 form the capacitor array 230, and a ti-nitride layer 255, a poly-silicon layer 260 and the oxide layer 270 cover the capacitor array 230 in order. The ti-nitride layer 255 and the poly-silicon layer 260 are conductive material used to enhance structural strength. Further, the ti-nitride layer 255, the poly-silicon layer 260 and the oxide layer are formed along the supporting layers 240, 243 and 246. Therefore, the oxide layer 270 extends along the third direction D3, which has an angle θ with respect to the first direction D1 where the rod capacitors 232. As mentioned above, the oxide layer 270 has a smooth slope covering the side 230S of the capacitor array 230, and the localized stress can be reduced.

Through operations 310-345, the capacitance structure 200 is provided and illustrated in FIG. 4H. In this embodiment, the capacitance structure 200 is a symmetry trapezoid. A length of the supporting layer 243 is greater than a length of the supporting layer 240, a length of the supporting layer 246 is greater than a length of the supporting layer 243. The oxide layer 270 extends from the top 230T of capacitor array 230 to the substrate 210 along the supporting layers 240, 243 and 246 (e.g. along the third direction D3) smoothly.

In FIG. 4H, further form oxide material 276 covering the oxide layer 270. The oxide material 276 is insulating material used to insulating capacitor array 230. Since the oxide layer 270 has smooth slope, the covering oxide material 276 can have less localized stress within.

Figure 5:
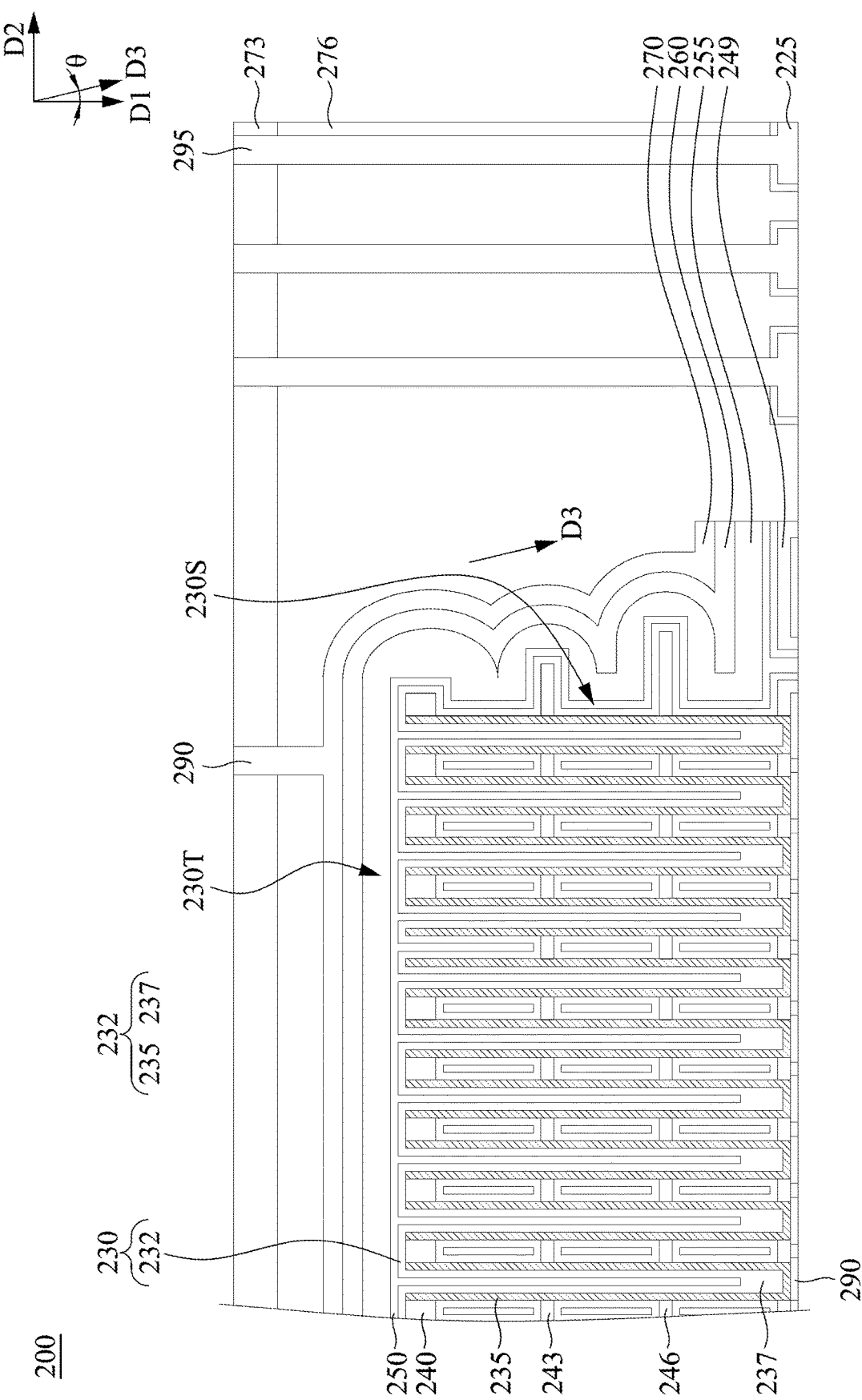
FIG. 5 illustrates another cross-section view of the capacitance structure connected to conductive lines.

FIG. 5 illustrates another cross-section view of the capacitance structure 200 connected to conductive lines 290 and 295. FIG. 5 is another cross-section view of the capacitance structure 200, which is further connecting the conductive lines 290. In addition, FIG. 5 is a local cross section view of FIG. 2. A plurality of transistors is formed within the substrate 210 and has a plurality of exposed contacts 220 on a top surface of the substrate 210, and each exposed contact 220 is connected to a corresponding one of the rod capacitors 232 of the capacitor array 230.

In FIG. 5, oxide material 273 is further formed on the oxide material 276. Both oxide material 273 and 276 cover the oxide layer 270 to insulate capacitor array 230 and exposed contacts 225. Conductive line 290 extends from a top side of the oxide material 273 to the conductive tungsten layer 260 through the oxide layer 270 and the oxide material 276. Conductive lines 295 extend from a top side of the oxide material 273 to the exposed contacts 225 through the oxide material 276 and the nitride film 249. Since the localized stress within the oxide material 276 is reduced, the unexpected short would not appear between the conductive lines 295.

As shown in FIG. 5, the top side of the oxide material 273 is flattened. In this embodiment, the top side of the oxide material 273 is flattened by a chemical mechanical planarization process.

In summary, the present disclosure provides a capacitance structure and a manufacturing method of the capacitance structure. The capacitance structure includes capacitor array formed by rod capacitor, and an oxide layer covers the capacitor array. The oxide layer can be formed along the supporting layers connecting the rod capacitors, wherein the supporting layers are arranged in a trapezoid-like arrangement. The forming oxide layer can have smooth extension, and the total stress can be reduced. Therefore, the unexpected short caused by stress pressure can be avoided.

The foregoing has described features of several embodiments so that those skilled in the art may better understand the description in various aspects. It will be apparent to those skilled in the art that various modifications and variations can be made to the structure of the embodiments of the present disclosure without departing from the scope or spirit of the present disclosure. In view of the foregoing, it is intended that the present disclosure cover modifications and variations, provided they fall within the scope of the following claims.

What is claimed is:

1. A capacitance structure comprising:
a substrate;
a plurality of rod capacitors located on a top surface of the substrate and forming a capacitor array, wherein the rod capacitors extend along a first direction perpendicular to a second direction in which the top surface of the substrate extends; and
an oxide layer covering a top and a side of the capacitor array and a portion of the substrate, wherein the oxide layer extends from the top of the capacitor array to the substrate along a third direction, and an angle is formed between the first and third directions.

2. The capacitance structure of claim 1, further comprising:
a first supporting layer and a second supporting layer connecting sides of the rod capacitors and covered by the oxide layer, wherein each of the first and second supporting layers protrudes from the side of the capacitor array in the second direction, the first supporting layer is located between the second supporting layer and the top surface of the substrate, and the first supporting layer has an extra length with respect to the second supporting layer in the second direction such that a length of the first support layer is greater than a length of the second supporting layer and the oxide layer extends along the third direction.

3. The capacitance structure of claim 2, wherein the second supporting layer is located at the top of the capacitor array.

4. The capacitance structure of claim 1, wherein each rod capacitor comprises an insulating tube filled with conductive material.

5. The capacitance structure of claim 4, wherein the conductive material of the rod capacitors is a film covering and contacting the insulating tubes.

6. The capacitance structure of claim 5, further comprising a plurality of third supporting layers connecting sides of the insulating tubes, wherein the film further covers the third supporting layers.

7. The capacitance structure of claim 1, wherein a plurality of transistors is formed within the substrate, each transistor has a contact exposed to the top surface of the substrate, and each rod capacitor is connected to the contact of a corresponding one of the transistors.

8. The capacitance structure of claim 1, further comprising:
 a conductive layer located between the capacitor array and the oxide layer and electrically connected to the rod capacitors.

9. The capacitance structure of claim 8, further comprising:
 an insulating material covering the oxide layer and the capacitor array; and
 a conductive line extending to the conductive layer through the insulating material along the first direction.

\* \* \* \* \*